Figure 1:
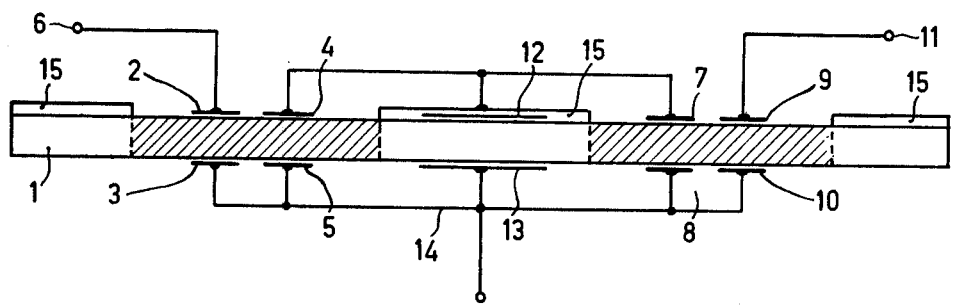

United States Patent [19]

De Wild

[11] 4,037,180
[45] July 19, 1977

[54] ELECTRO-MECHANICAL FILTER

[75] Inventor: Willem Reindert De Wild, Eindhoven, Netherlands

[73] Assignee: U.S. Philips Corporation, New York, N.Y.

[21] Appl. No.: 658,170

[22] Filed: Feb. 17, 1976

[30] Foreign Application Priority Data

Mar. 6, 1975  Netherlands ............... 7502640

[51] Int. Cl.² ............... H03H 9/02; H03H 9/26; H03H 9/32
[52] U.S. Cl. ............... 333/72; 310/8.2; 310/9.8
[58] Field of Search ............... 333/72, 30 R; 310/8, 310/8.2, 9.7, 9.8; 427/100

[56] References Cited

U.S. PATENT DOCUMENTS 3,487,137  12/1969  Kopel ............... 310/8.2
3,544,926  12/1970  Hurtig ............... 333/72

Primary Examiner—Alfred E. Smith
Assistant Examiner—Marvin Nussbaum
Attorney, Agent, or Firm—Frank R. Trifari; Bernard Franzblau

[57] ABSTRACT

An electromechanical filter, e.g. two duals, in which undesired resonances are damped out. A special choice of the damping material leads to a substantial improvement.

6 Claims, 5 Drawing Figures

ELECTRO-MECHANICAL FILTER

The invention relates to an electromechanical filter, comprising a wafer of a piezoelectric material, on which input and output electrodes are disposed, an electrical input oscillation being applied in operation to the input electrodes and being converted by the piezoelectric material into a corresponding mechanical vibration which reaches the output electrode where it is re-converted into an electrical output oscillation. The transmission characteristic of input to output oscillation exhibits a specific frequency dependence which is determined by the mechanical resonance properties of the wafer and a damping material is disposed on the wafer outside the area where in input and output electrodes are situated. In English literature such a filter is also referred to as a "dual". Generally, use is made of the transverse resonance of the wafer, at which frequency the transmission is a maximum, whereas beyond this frequency the transmission is some tens of dB's lower.

In practice it has been found that the transmission characteristic outside the transmission band — this is the band near the resonance frequency — is very irregular, which may be attributed to various modes of vibration which are influenced by the length and width dimensions of the wafer. This irregularity in itself would not be such a drawback, because as previously stated, the damping level is on an average some tens of dB's higher than in the transmission band, were it not that in the peaks this damping level is too low to meet the requirements imposed by the use of the filter in radio or television sets. Moreover, the steep edges in the damping characteristic may give rise to demodulation products of unwanted stations so that the reception of the desired station would be disturbed.

The invention provides a very simple means of improving this transmission characteristic and is characterized in that the damping material consists of an elastic base material (e.g. a synthetic resin) through which a powder of a material of substantially higher specific gravity (e.g. a metal powder) is mixed. Owing to this step the damping within the transmission band is hardly influenced, whereas that outside the transmission band is not only increased, but in particular the irregular character with peaks of too low a damping level is eliminated.

Figure 2:
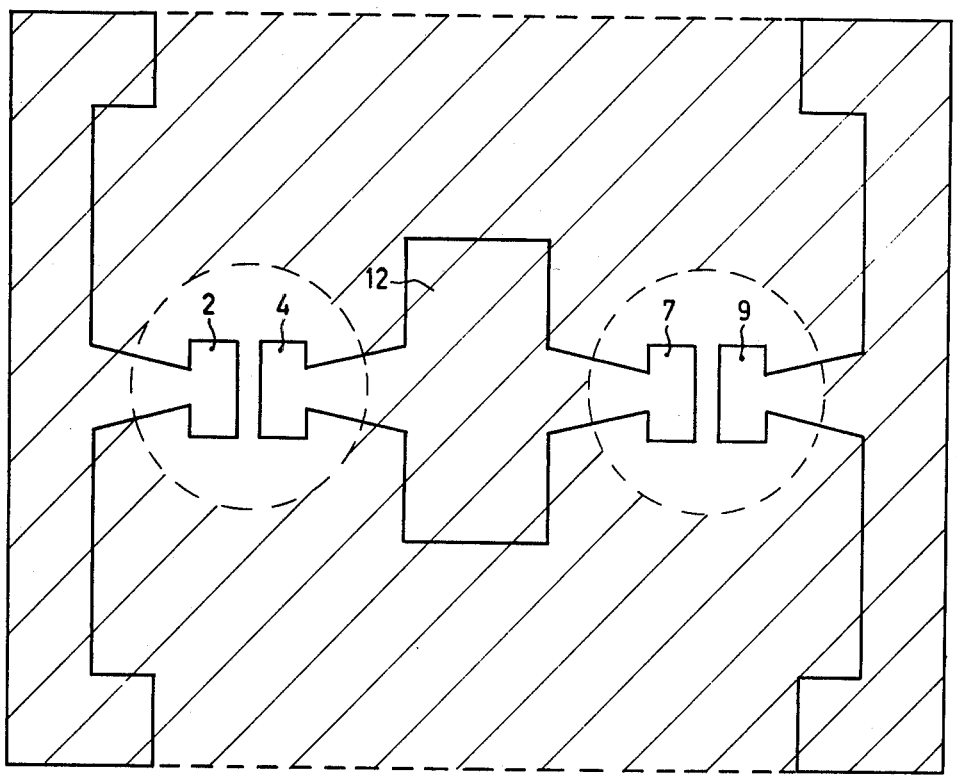
Figure 3:
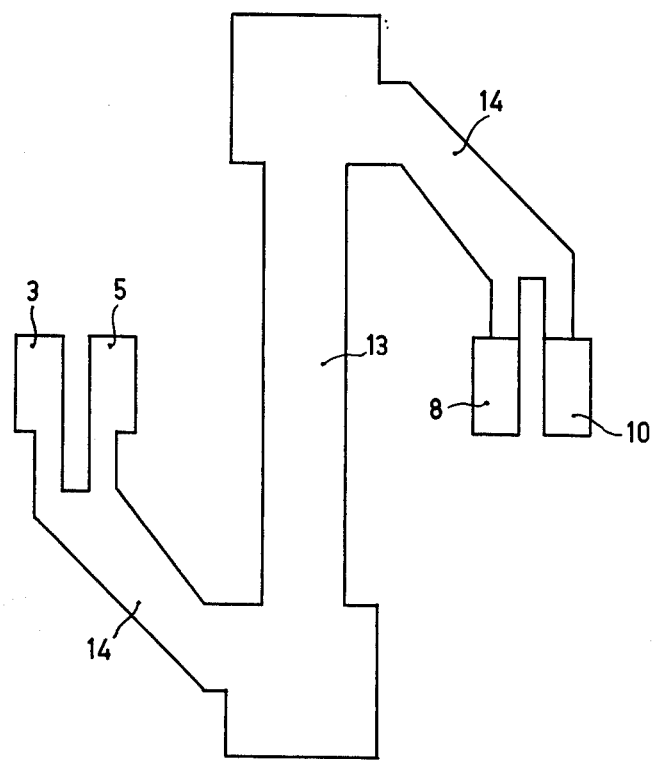
Figure 4:
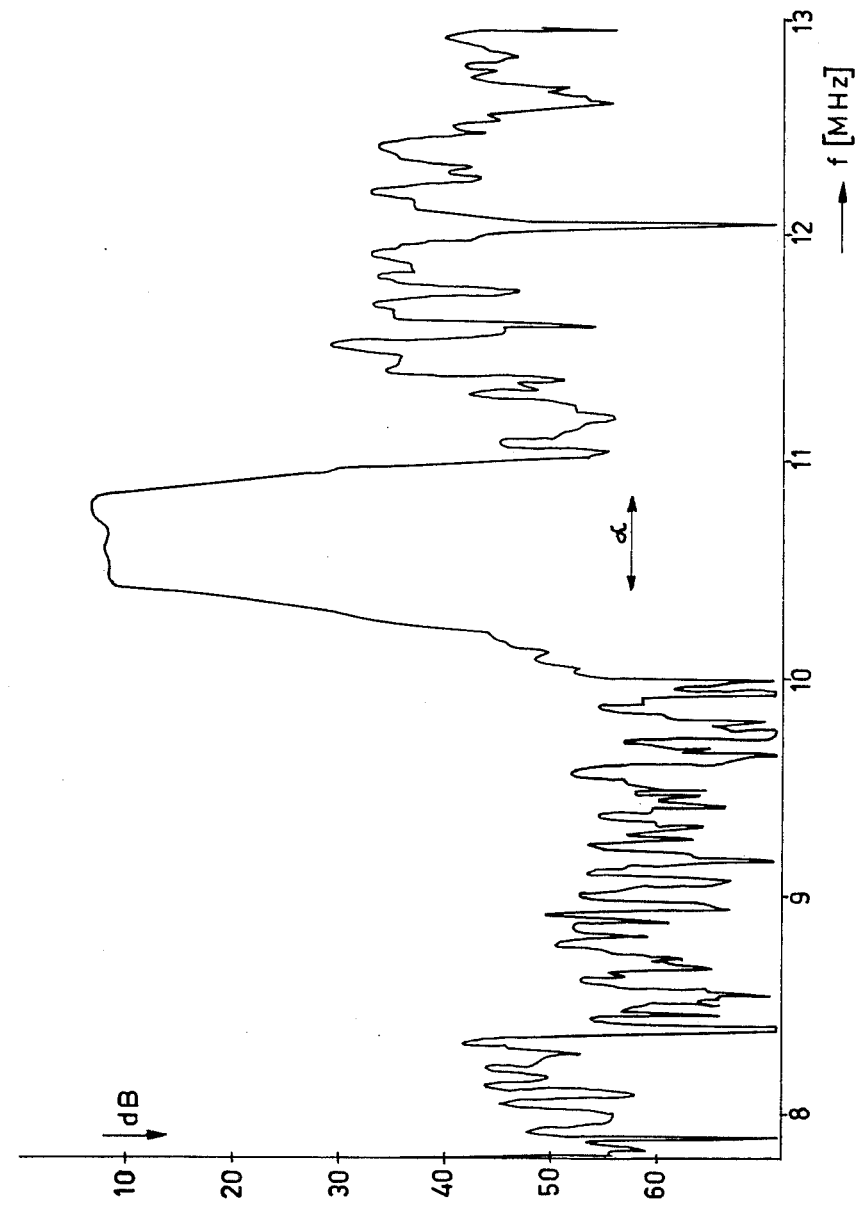
Figure 5:
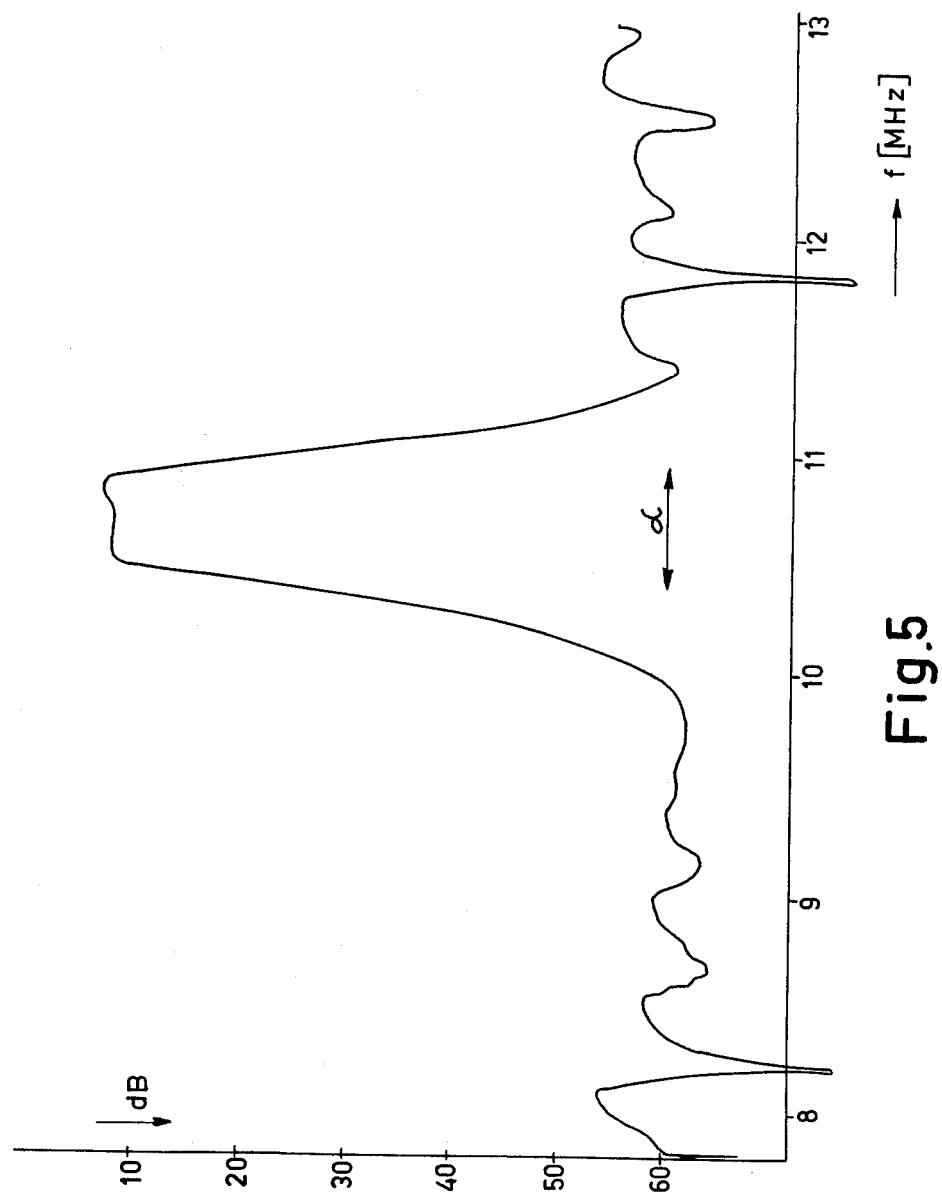

The invention will be described with reference to the drawing, in which:

FIG. 1 shows a side view,
FIG. 2 a plan view, and
FIG. 3 a bottom view of an electro-mechanical filter according to the invention.
FIG. 4 represents a transmission characteristic of a filter which does not embody the step according to the invention, and
FIG. 5 shows the transmission characteristic after applying the step according to the invention.

In FIG. 1 the reference numeral 1 refers to a wafer of a piezoelectric material. The wafer is for example rectangular in shape with length and width dimensions of a few millimeters, the thickness being of the order of magnitude of 0.2 mm. For the material of the wafer 1, for example, a lead-titanate-zirconate or niobate is chosen, which, as is known, has excellent piezoelectric properties after internal polarization. On the wafer 1 are arranged electrodes 2 and 3 acting as input electrodes and electrodes 4 and 5 acting as first output electrodes. The material of the wafer 1 is polarized at the location of these electrodes 2, 3, 4 and 5 so that an alternating electrical input vibration, applied via the input 6 to the input electrode 2, causes the wafer 1, between the electrodes 2 and 3, to vibrate mechanically, which vibration propagates to the electrodes 4 and 5 where it is converted into a corresponding alternating electrical output signal. The wafer 1 with the electrodes 2, 3, 4 and 5 thus forms a so-called dual, whose electrical transmission characteristic is substantially determined by the transverse resonance of the wafer 1.

In FIG. 1 a second dual is provided, comprising the electrodes 7, 8, 9 and 10, the otuput electrode 4 of the first dual being coupled to the input electrode 7 of the second dual, while the electric output vibration is taken from the output 11 which is connected to the output electrode 9 of the second dual. Furthermore, in the electric coupling between the electrodes 4 and 7 a capacitor is included, consisting of the electrodes 12 and 13 at the location of non-polarized material of the plate 1. The electrodes 3, 5, 13, 8 and 10 are connected together by a conductor 14. The capacitor 12, 13 ensures that the electrical energy produced in the electrode 4 is transferred to the electrode 7 to a satisfactory extent.

FIG. 2 is a plan view of the plate 1 with the electrodes 2, 4, 12, 7 and 9 in accordance with FIG. 1.

FIG. 3 shows a ditto bottom view with the electrodes 3, 5, 13, 8 and 10 and the interconnections 14.

Without any further measures a transmission characteristic, as a function of the frequency, between the electric input vibration at the input terminal 6 and the electrical output vibration at the output terminal 11 is found to be as shown in FIG. 4. The frequency $f$ is plotted horizontally and the transmission or the negative damping of the filter vertically. Near the transverse resonant frequency of the wafer 1 the transmission is a maximum and the damping a minimum. Outside this so-called transmission band $d$ the transmission characteristic has a very irregular character as can be seen from the many peaks and dips in FIG. 4. Attempts have been made to damp out such undesired resonances with the aid of epoxy resins or metal alloys, but the results of these attempts were poor.

In order to improve the transmission characteristic, according to the invention, a damping material 15 (FIG. 1) is applied to the wafer 1, but outside the electrodes 2, 4, 7 and 9, shown shaded in FIG. 2. A polyester weighted with tungsten powder is selected as damping material. Generally, this damping material consists of an elastic base (polyester or other synthetic resin), through which a powder of a material (tungsten or other metal powder) of a substantially higher specific gravity than the base material is mixed. This powder together with the elastic base material forms a multitude of resonators, whose resonant frequencies cover a wide frequency band around the desired transmission band of the filter. These resonators are excited by the mechanical vibrations produced in the wafer 1 and damp out vibrations outside the desired vibration range which vibrations emerge near the electrodes 2, 4 and 7, 9. By the choice of a suitable grain size and packing density of the powder this yields a good acoustic matching between the wafer 1 and the damping layer 15, so that reflections are avoided. Of course, the damping material need not cover the wafer 1 completely, but it is essential that the mechanical vibrations outside the portions of the duals which are active are suppressed as far as possible. If desired, the damping layer between the electrodes 4 and 7 may be dispensed with so that electric and mechanical coupling between the two duals would be obtained, but in that case the risk of undesired resonances, i.e. peaks of reduced damping outside the transmission band, increase. In FIG. 1 only a damping layer 15 is shown at the upper surface of the wafer. In principle it is also possible to apply a damping layer to the lower surface. The thickness of the layer 15 is substantially smaller than that of the wafer 1. The result is shown in FIG. 5, which shows that the transmission in the transmission band $d$ is substantially unchanged, whereas outside this transmission band $d$ the damping has increased and, in particular, the irregular character has been substantially reduced. The peaks of minimum damping are situated substantially lower than in FIG. 4.

What is claimed is:

1. An electromechanical filter, comprising a wafer of a piezoelectric material having input and output electrodes arranged thereon so that in operation an electrical input signal applied to the input electrodes produces in the piezoelectric material a corresponding mechanical vibration which is re-converted into an electrical output signal at the output electrodes, the transmission characteristic of the input to output signals exhibiting a specific frequency dependence which is determined by the mechanical resonance properties of the wafer, and an acoustic damping material disposed on the wafer outside the area where the input and output electrodes are situated and comprising an elastic base material throughout which a powder of a material of substantially higher specific gravity is mixed.

2. A filter as claimed in claim 1, comprising two sets of input and two sets of output electrodes, means connecting one output electrode of the first set to one input electrode of the second set, and a capacitor including a further electrode on one side of the wafer and a counter electrode on the other side of the wafer, said further electrode being coupled to said one input and output electrodes via said connecting means, characterized in that the damping material is situated at the location of at least one of the two electrodes of said capacitor.

3. A filter as claimed in claim 1 wherein said elastic base material comprises a synthetic resin and said powder material comprises a metal powder.

4. A filter as claimed in claim 1 wherein said input and output electrodes comprise, a first pair of input electrodes located in opposed relation on opposite major surfaces of the wafer, a first pair of output electrodes located in opposed relation on opposite major surfaces of the wafer and spaced apart from said first pair of input electrodes, a second pair of input electrodes located in opposed relation on opposite major surfaces of the wafer and spaced apart from said first pairs of input and output electrodes, a second pair of output electrodes located in opposed relation on opposite major surfaces of the wafer and spaced apart from said second pair of input electrodes, means electrically connecting said first pair of output electrodes to said second pair of input electrodes, and electricl input and output terminal means connected to said first pair of input electrodes and to said second pair of output electrodes, respectively.

5. A filter as claimed in claim 4 further comprising first and second electrodes located in opposed relation on opposite major surfaces of the wafer to form a capacitor and spaced apart from and intermediate said first and second pairs of electrodes, part of the damping material being situated in the area of at least one of said capacitor electrodes, and means electrically connecting said capacitor first and second electrodes to the output electrodes of said first pair of electrodes and to the input electrodes of said second pair of electrodes.

6. A filter as claimed in claim 5 wherein the sole coupling between the input and output electrodes of said first pair of electrodes and between the input and output electrodes of said second pair of electrodes is via the acoustic coupling of said piezoelectric wafer.

* * * * *